(12) United States Patent
Okazaki

(10) Patent No.: US 8,405,112 B2
(45) Date of Patent: *Mar. 26, 2013

(54) THIN-LIGHT EMITTING DIODE LAMP, AND METHOD OF MANUFACTURING THE SAME

(75) Inventor: Tomokazu Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/176,291

(22) Filed: Jul. 5, 2011

(65) Prior Publication Data

US 2011/0284904 A1    Nov. 24, 2011

Related U.S. Application Data

(63) Continuation of application No. 12/160,051, filed as application No. PCT/JP2006/326047 on Dec. 27, 2006, now Pat. No. 8,004,002.

(30) Foreign Application Priority Data

| Jan. 4, 2006 | (JP) | 2006-000210 |
| Jan. 4, 2006 | (JP) | 2006-000256 |

(51) Int. Cl.
*H01L 33/00* (2010.01)

(52) U.S. Cl. ...... 257/98; 257/99; 257/100; 257/E33.058; 257/E33.061; 257/E33.067; 313/501

(58) Field of Classification Search ............ None
See application file for complete search history.

(56) References Cited

U.S. PATENT DOCUMENTS

| 6,914,265 B2 | 7/2005 | Bawendi et al. | |
| 6,917,057 B2 * | 7/2005 | Stokes et al. | 257/98 |
| 6,960,878 B2 | 11/2005 | Sakano et al. | |
| 7,129,638 B2 * | 10/2006 | Ng | 313/512 |
| 7,772,597 B2 | 8/2010 | Inoue | |
| 2005/0224818 A1 | 10/2005 | Harada | |
| 2006/0099449 A1 | 5/2006 | Amano et al. | |
| 2007/0221934 A1 | 9/2007 | Inoue | |

FOREIGN PATENT DOCUMENTS

| JP | 2001-036147 | 2/2001 |
| JP | 2002-118293 | 4/2002 |
| JP | 2002-510866 | 4/2002 |
| JP | 2003-249689 | 9/2003 |
| JP | 2005-167079 | 6/2005 |
| JP | 2005-228996 | 8/2005 |
| JP | 2005-340494 | 8/2005 |
| JP | 2005-277127 | 10/2005 |
| JP | 2005-294484 | 10/2005 |
| JP | 2005-317820 | 11/2005 |

* cited by examiner

*Primary Examiner* — Jerome Jackson, Jr.

(74) *Attorney, Agent, or Firm* — Hamre, Schumann, Mueller & Larson, P.C.

(57) ABSTRACT

A thin-type light emitting diode lamp includes a blue light emitting diode chip (6) disposed at a substantial center of an inner bottom surface of a groove-shaped recess (3) formed at an end surface and having a thin elongated rectangular opening, a red light conversion layer (7) covering the blue light emitting diode chip (6) and made of a light-transmitting synthetic resin containing powder of a red fluorescent material which emits red light when excited by blue light emitted from the blue light emitting diode chip, and a green light conversion layer (10) made of a light-transmitting synthetic resin containing powder of a green fluorescent material which emits green light when excited by the blue light. The light emitting diode lamp further includes a light transmitting layer (9) intervening between the red light conversion layer (7) and the green light conversion layer (10). The light transmitting layer contains neither the red fluorescent material nor the green fluorescent material or contains the red fluorescent material or the green fluorescent material only by a small amount.

10 Claims, 9 Drawing Sheets

THIN-LIGHT EMITTING DIODE LAMP, AND METHOD OF MANUFACTURING THE SAME

CROSS REFERENCE TO RELATED APPLICATIONS

This application is a Continuation of U.S. Ser. No. 12/160,051 filed Jul. 3, 2008, which is a U.S. National Stage of PCT/JP2006/326047, filed Dec. 27, 2006, which are incorporated herein by reference.

TECHNICAL FIELD

The present invention relates to a thin-type light emitting diode lamp used for a backlight source of a liquid crystal display device, for example, and also to a method of manufacturing such a lamp.

BACKGROUND ART

Examples of conventional thin-type light emitting diode lamp are disclosed in Patent Document 1 and Patent Document 2. In these light emitting diode lamps, a groove-shaped recess having an elongated rectangular opening is formed at the front end surface of the lamp body. A light emitting diode chip is mounted at a substantial center of the inner bottom surface of the groove-shaped recess. The side surfaces of the groove-shaped recess are inclined to cause the light from the light emitting diode chip to be emitted from the elongated rectangular opening.

In recent years, a GaN-based light emitting diode chip which emits blue light has been developed. The blue light emitting diode chip is known to exhibit high brightness. As disclosed in Patent Document 3 and Patent Document 4, such a blue light emitting diode chip can be used for a white light emitting device designed to emit white light.

The conventional white light emitting device disclosed in these documents includes a red light conversion layer made of a light-transmitting synthetic resin containing powder of a red fluorescent material which emits red light when excited by blue light, and a green light conversion layer made of a light-transmitting synthetic resin containing powder of a green fluorescent material which emits green light when excited by blue light. With this arrangement, by causing the blue light emitted from the blue light emitting diode chip to pass through the red light conversion layer, red light is emitted from the red light conversion layer. By causing the blue light after passing through the red light conversion layer to passe through the green light conversion layer, green light is emitted from the green light conversion layer. The blue light emitted from the blue light emitting diode chip, the red light emitted from the red light conversion layer and the green light emitted from the green light conversion layer are combined to produce white light for emission.

In the structure disclosed in Patent Document 3, the green light conversion layer is formed in close contact with the obverse surface of the blue light emitting diode chip, and the red light conversion layer is formed in close contact with the outer surface of the green light conversion layer. In the structure disclosed in Patent Document 4, a red light conversion layer and a green light conversion layer formed in close contact with the outer surface of the red light conversion layer are arranged at a position separate from the blue light emitting diode chip.

By applying the above-described white light emitting device to a thin-type light emitting diode lamp having the above-described structure, a thin-type light emitting diode lamp which emits white light is obtained. Specifically, in the thin-type light emitting diode lamp, a blue light emitting diode chip is mounted at a substantial center of the inner bottom surface of the groove-shaped recess. The blue light emitting diode chip is covered with a red light conversion layer, and a green light conversion layer is formed on the outer side of the red light conversion layer. With this arrangement, white light is emitted from the elongated rectangular opening of the groove-shaped recess of the thin-type light emitting diode lamp.

Patent Document 1: JP-A-2001-36147
Patent Document 2: JP-A-2005-317820
Patent Document 3: JP-A-2002-510866
Patent Document 4: JP-A-2005-228996

The wavelength of blue light is about 450 nm, which is the shortest. The wavelength of green light is about 530 nm. The wavelength of red light is about 650 nm, which is the longest. Light having a shorter wavelength is more likely to be absorbed than light having a longer wavelength. Thus, when a red light conversion layer and a green light conversion layer are arranged in close contact with each other, part of the green light emitted from the green light conversion layer, which has a shorter wavelength, is directly absorbed by the red light conversion layer. Thus, the amount of the green light emitted from the green light conversion layer reduces by as much as the amount absorbed by the red light conversion layer. The green light absorbed by the red light conversion layer is converted into thermal energy to be consumed.

Thus, in the above-described arrangement, to make the light obtained by conversion close to white light, the amount of green light needs to be increased. For this purpose, the content of the green fluorescent material in the green light conversion layer needs to be increased. Further, since green light is absorbed, the brightness of the white light deteriorates correspondingly.

Moreover, since the groove-shaped recess is elongated, the path of light emitted from the blue light emitting diode chip becomes longer as progressing away from the blue light emitting diode chip in the longitudinal direction of the groove-shaped recess. Thus, of the light emitted from the blue light emitting diode chip, the part to be emitted from the portions adjacent to the two ends of the elongated rectangular opening of the groove-shaped recess is not sufficiently converted into red light by the red light conversion layer, because it travels through a relatively long path. As a result, the white light emitted from different portions of the elongated rectangular opening of the groove has different tones, which is not desirable.

DISCLOSURE OF THE INVENTION

Problems to be Solved by the Invention

A technical object of the present invention is to provide a thin-type light emitting diode lamp capable of solving the above-described problems and a manufacturing method of such a lamp.

Means for Solving the Problems

According to a first aspect of the present invention, there is provided a thin-type light emitting diode lamp comprising a lamp body including an end surface formed with a groove-shaped recess having a thin elongated rectangular opening, a blue light emitting diode chip disposed at a substantial center of an inner bottom surface of the recess of the lamp body, a red light conversion layer covering the blue light emitting diode chip and made of a light-transmitting synthetic resin containing powder of a red fluorescent material which emits red light when excited by blue light emitted from the blue light emitting diode chip, and a green light conversion layer made of a light-transmitting synthetic resin containing powder of a green fluorescent material which emits green light when excited by the blue light. The light emitting diode lamp further comprises a light transmitting layer intervening between the red light conversion layer and the green light conversion layer. The light transmitting layer contains neither the red fluorescent material nor the green fluorescent material or contains the red fluorescent material or the green fluorescent material by an amount smaller than that contained in the red light conversion layer or the green light conversion layer.

Preferably, in the thin-type light emitting diode lamp as set forth in claim 1, the light transmitting layer may comprise a space.

Preferably, in the thin-type light emitting diode lamp as set forth in claim 1, the light transmitting layer may be made of a light-transmitting synthetic resin.

Preferably, in the thin-type light emitting diode lamp as set forth in any one of claims 1-3, the red light conversion layer may be thicker at portions contacting two side surfaces of the blue light emitting diode chip which extend perpendicularly to a longitudinal direction of the recess than at portions contacting other two side surfaces of the blue light emitting diode chip which extend in the longitudinal direction of the recess.

According to a second aspect of the present invention, there is provided a method of making a thin-type light emitting diode lamp. The method comprises a first step of mounting a blue light emitting diode chip at a substantial center of an inner bottom surface of a groove-shaped recess formed at an end surface of a lamp body, a second step of forming a red light conversion layer to cover the blue light emitting diode chip by using a light-transmitting synthetic resin containing powder of a red fluorescent material which emits red light when excited by blue light emitted from the blue light emitting diode chip, and a third step of forming a green light conversion layer on an outer side of the red light conversion layer by using a light-transmitting synthetic resin containing powder of a green fluorescent material which emits green light when excited by the blue light. The second step comprises the step of injecting a light-transmitting synthetic resin in a liquid state containing powder of a red fluorescent material into the recess, the step of maintaining a posture in which an opening of the recess is oriented upward, and the step of hardening the light-transmitting synthetic resin in the liquid state while keeping the posture.

According to a third aspect of the present invention, there is provided a method of making a thin-type light emitting diode lamp. The method comprises a first step of forming a red light conversion layer to cover a blue light emitting diode chip by using a light-transmitting synthetic resin containing powder of a red fluorescent material which emits red light when excited by blue light emitted from the blue light emitting diode chip, a second step of mounting the blue light emitting diode chip at a substantial center of an inner bottom surface of a groove-shaped recess formed at an end surface of a lamp body, and a third step of forming a green light conversion layer on an outer side of the red light conversion layer by using a light-transmitting synthetic resin containing powder of a green fluorescent material which emits green light when excited by the blue light. In the first step, the red light conversion layer is formed to be thicker at portions contacting two side surface of the blue light emitting diode chip which extend perpendicularly to a longitudinal direction of the recess than at portions contacting other two side surfaces of the blue light emitting diode chip which extend in the longitudinal direction of the recess.

Preferably, in the method of making a thin-type light emitting diode lamp as set forth in claim 5 or 6, the third step may comprise the step of injecting a light-transmitting synthetic resin in a liquid state containing powder of a green fluorescent material into the groove-shaped recess, the step of maintaining a posture in which an opening of the groove-shaped recess is oriented downward, and the step of hardening the light-transmitting synthetic resin in the liquid state while keeping the posture.

BEST MODE FOR CARRYING OUT THE INVENTION

Preferred embodiments of the present invention will be described below with reference to the accompanying drawings.

Figure 1:
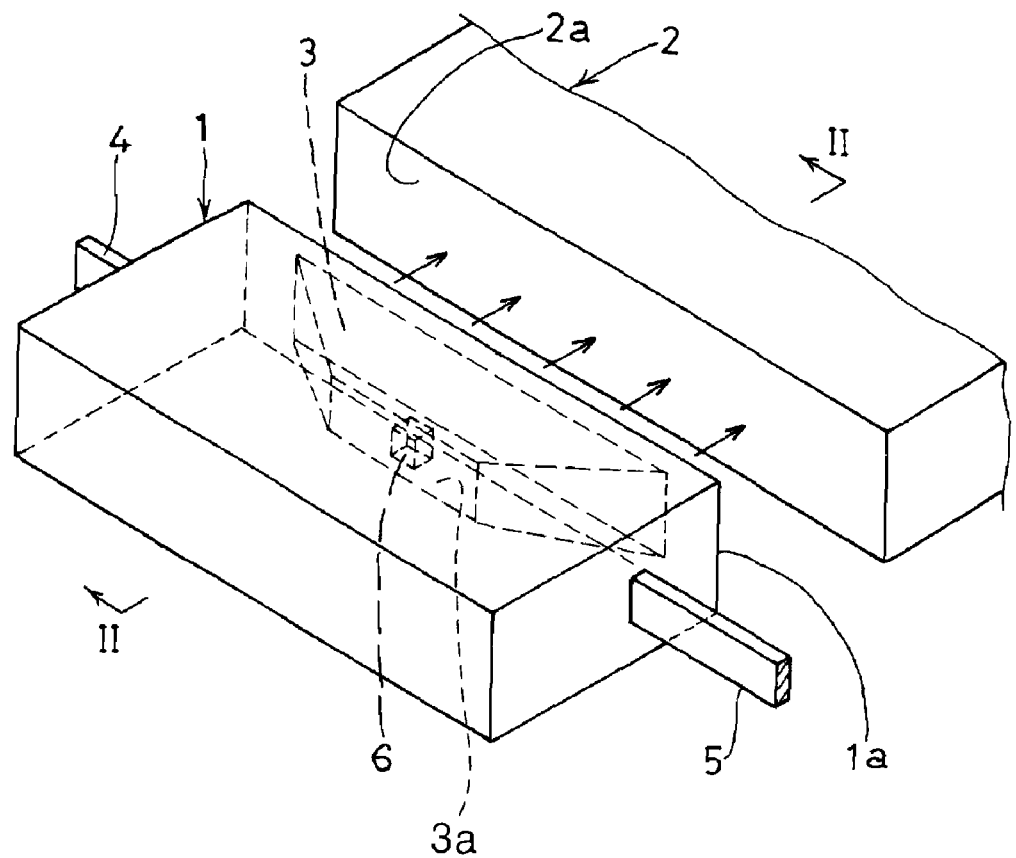
FIG. 1 is a perspective view showing a thin-type light emitting diode lamp according to a first embodiment of the present invention.
Figure 2:
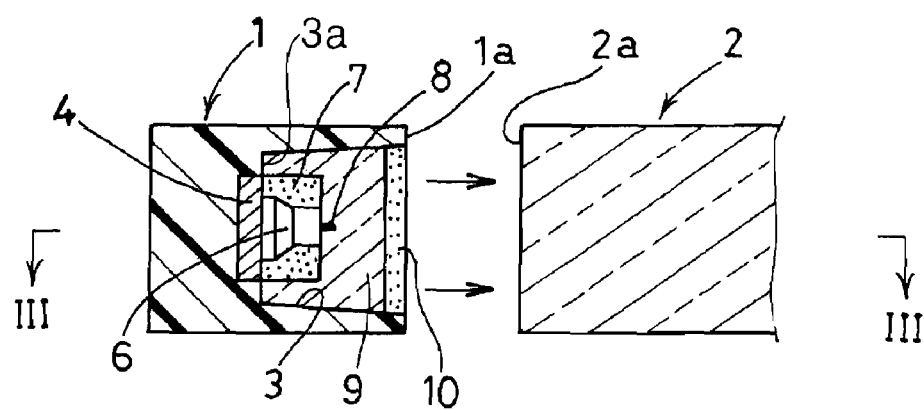
FIG. 2 is a sectional view taken along lines II-II in FIG. 1.
Figure 3:
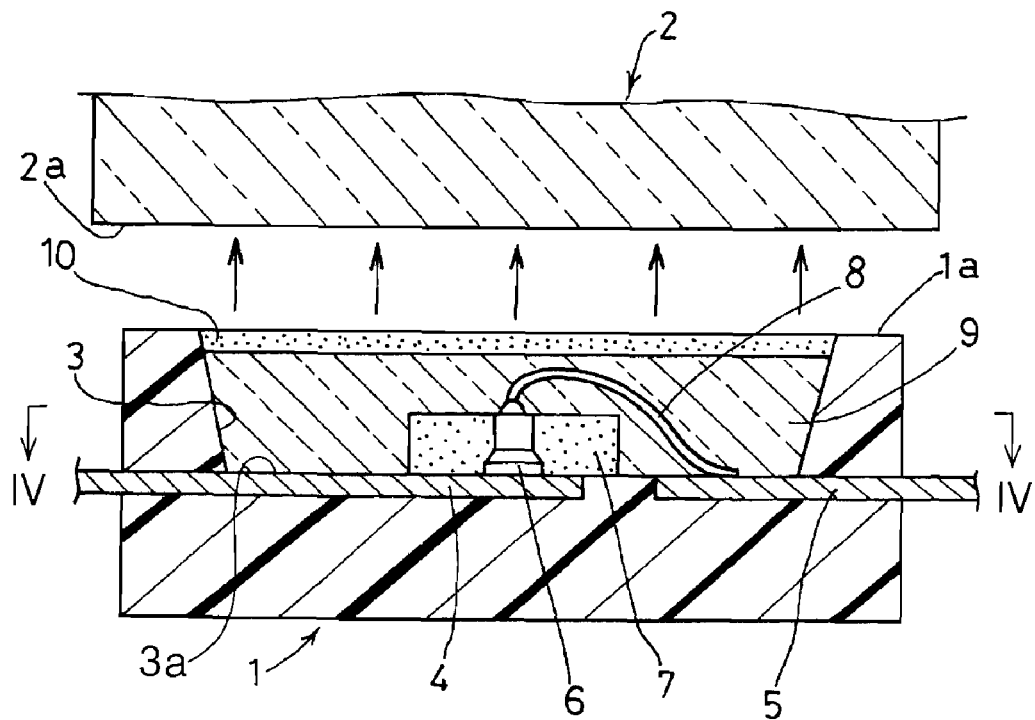
FIG. 3 is a sectional view taken along lines in FIG. 2.
Figure 4:
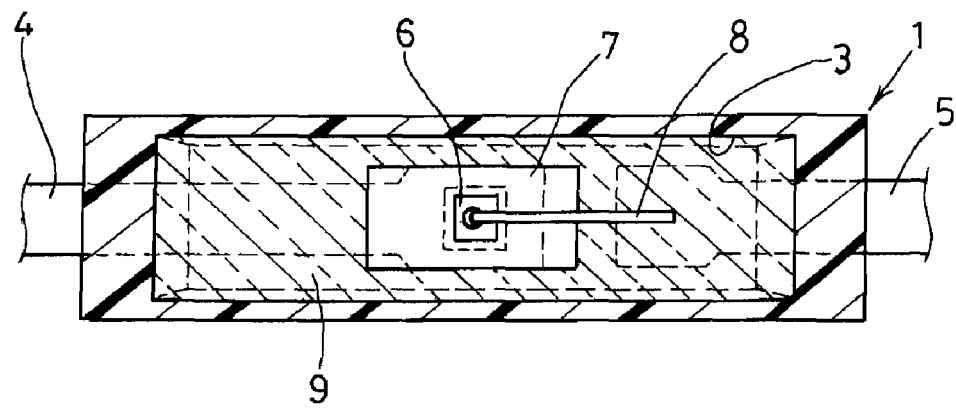
FIG. 4 is a sectional view taken along lines IV-IV in FIG. 3.

FIG. 1 is a perspective view showing a thin-type light emitting diode lamp according to a first embodiment of the present invention. FIG. 2 is a sectional view taken along lines II-II. FIG. 3 is a sectional view taken along lines in FIG. 2. FIG. 4 is a sectional view taken along lines IV-IV in FIG. 3.

In FIGS. 1-4, the reference sign 1 indicates a lamp body made of an insulating material such as synthetic resin. The reference sign 2 indicates a transparent light guide plate arranged on a reverse surface of a non-illustrated liquid crystal display device. The light guide plate guides the light emitted from a thin-type light emitting diode lamp serving as a backlight source in this embodiment.

The lamp body 1 includes a front end surface 1a facing the light guide plate 2 and formed with a groove-shaped recess 3 having a thin elongated rectangular opening. A pair of lead terminals 4 and 5 made of a metal plate are embedded in the lamp body 1 to be exposed at the inner bottom surface of the groove-shaped recess 3. A diode chip 6 for emitting blue light is disposed at a substantial center of the inner bottom surface of the groove-shaped recess 3.

As shown in FIGS. 2-4, the side surfaces of the blue light emitting diode chip 6 are covered with a red light conversion layer 7. The opening of the groove-shaped recess 3 is entirely covered with a green light conversion layer 10. A light transmitting layer 9 is provided between the red light conversion layer 7 and the green light conversion layer 10 within the groove-shaped recess 3.

The red light conversion layer 7 is made of a light-transmitting synthetic resin containing powder of a red fluorescent material which emits red light when excited by the blue light emitted from the blue light emitting diode chip 6. The green light conversion layer 10 is made of a light-transmitting synthetic resin containing powder of a green fluorescent material which emits green light when excited by the blue light emitted from the blue light emitting diode chip 6. The light transmitting layer 9 is made of a light-transmitting synthetic resin which contains neither a red fluorescent material nor a green fluorescent material or contains only a small amount of fluorescent material.

Figure 5:
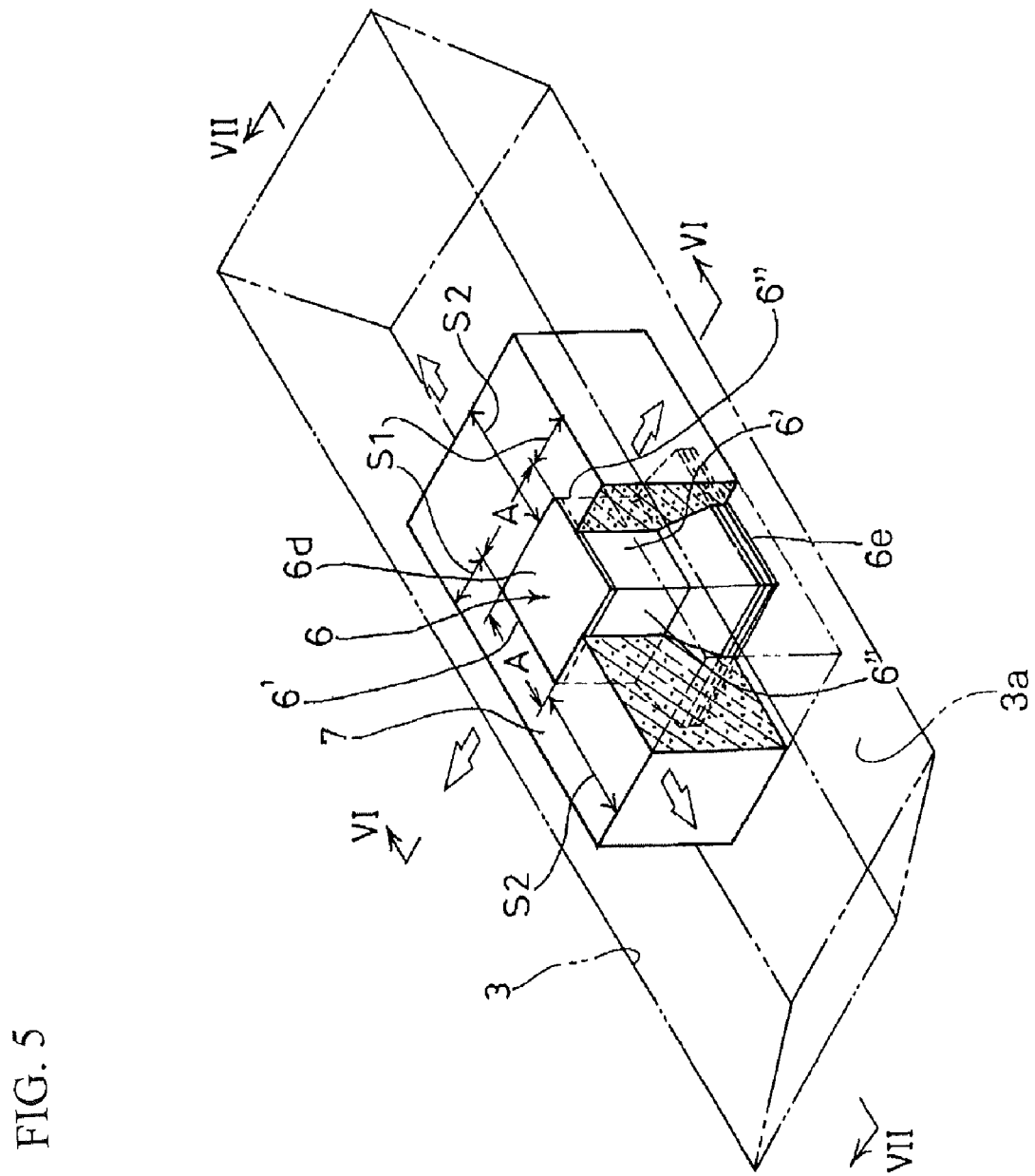
FIG. 5 is a perspective view showing a blue light emitting diode chip covered with a red light conversion layer.
Figure 6:
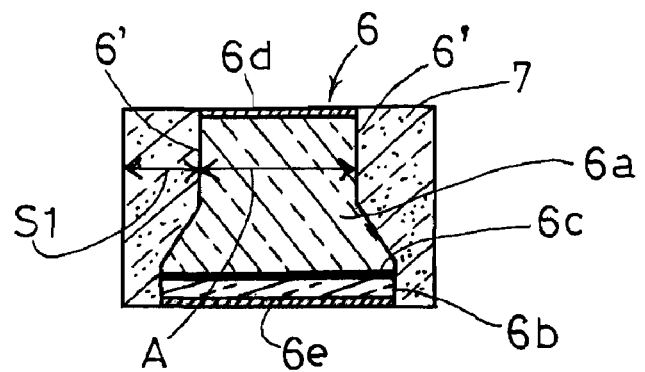
FIG. 6 is a sectional view taken along lines VI-VI in FIG. 5.
Figure 7:
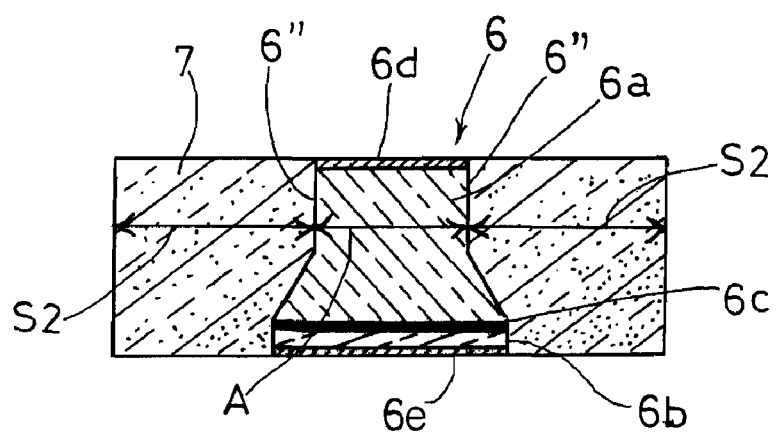
FIG. 7 is a sectional view taken along lines VII-VII in FIG. 5.

FIG. 5 is a perspective view showing the blue light emitting diode chip 6 whose side surfaces are covered with the red light conversion layer 7. In this embodiment, as shown in FIG. 5, the blue light emitting diode chip 6 whose side surfaces are covered with the red light conversion layer 7 is mounted at a substantial center of the inner bottom surface of the groove-shaped recess 3. FIG. 6 is a sectional view taken along lines VI-VI in FIG. 5. FIG. 7 is a sectional view taken along lines VII-VII in FIG. 5.

For instance, as shown in FIGS. 6 and 7, the blue light emitting diode chip 6 comprises a transparent n-type semiconductor layer 6a made of e.g. an n-type SiC crystal substrate and having a relatively large thickness, a p-type semiconductor layer 6b, a light emitting layer 6c for emitting blue light, an n-electrode 6d and a p-electrode 6e. The p-type semiconductor layer 6b is arranged on the lower surface of the n-type semiconductor layer 6a via the light emitting layer 6c. The n-electrode 6d is formed on the upper surface of the n-type semiconductor layer 6a. The p-electrode 6e is formed on the lower surface of the p-type semiconductor layer 6b.

As shown in FIG. 5, the blue light emitting diode chip 6 is so arranged that the two opposite side surfaces 6' extend generally in parallel with the longitudinal direction of the groove-shaped recess 3 whereas the other two opposite side surfaces 6" extend generally perpendicularly to the longitudinal direction of the groove-shaped recess 3. As shown in FIGS. 2-4, the p-electrode 6e on the lower surface of the blue light emitting diode chip 6 is electrically connected to the lead terminal 4 by boning (die bonding). The n-electrode 6d on the upper surface is electrically connected to the lead terminal 5 by wire bonding using a thin metal wire 8.

As shown in FIGS. 5-7, the thickness of the red light conversion layer 7 covering the side surfaces of the blue light emitting diode chip 6 differs between the portion on the side surfaces 6' and the portion on the side surfaces 6". Specifically, the red light conversion layer 7 has a relatively small thickness S1 at the portion on each of the side surfaces 6' while having a thickness S2, which is larger than the thickness S2, at the portion on each of the side surfaces 6".

With this arrangement, by causing the blue light emitted from the blue light emitting diode chip 6 to pass through the red light conversion layer 7, red light is emitted from the red light conversion layer 7. Further, by causing the blue light after passing through the red light conversion layer 7 to pass through the green light conversion layer 10, green light is emitted from the green light conversion layer 10. The blue light emitted from the blue light emitting diode chip 6, the red light emitted from the red light conversion layer 7 and the green light emitted from the green light conversion layer 10 are combined to produce white light, which is emitted from the opening of the groove-shaped recess 3 toward the light guide plate 2.

With the above-described structure, the blue light traveling from the blue light emitting diode chip 6 toward the two ends of the elongated rectangular opening of the groove-shaped recess 3 passes through the thicker portion of the red light conversion layer 7 which has the thickness S2. Thus, the conversion of the blue light into red light by the red light conversion layer 7 is sufficiently performed. As a result, the tone of the white light emitted from the elongated rectangular opening of the groove-shaped recess 3 is uniform at any point.

Further, since the light transmitting layer 9 intervenes between the red light conversion layer 7 and the green light conversion layer 10, the red light conversion layer 7 and the green light conversion layer 10 are not held in close contact with each other. This arrangement reliably reduces the possibility that the green light emitted from the green light conversion layer 10 is directly absorbed by the red light conversion layer. Since the absorption of the green light emitted from the green light conversion layer 10 reduces in this way, the content of the green fluorescent material in the green light conversion layer 10 can be reduced. Further, since the reduction in amount of green light is suppressed, the brightness of the emitted white light is enhanced.

Figure 8:
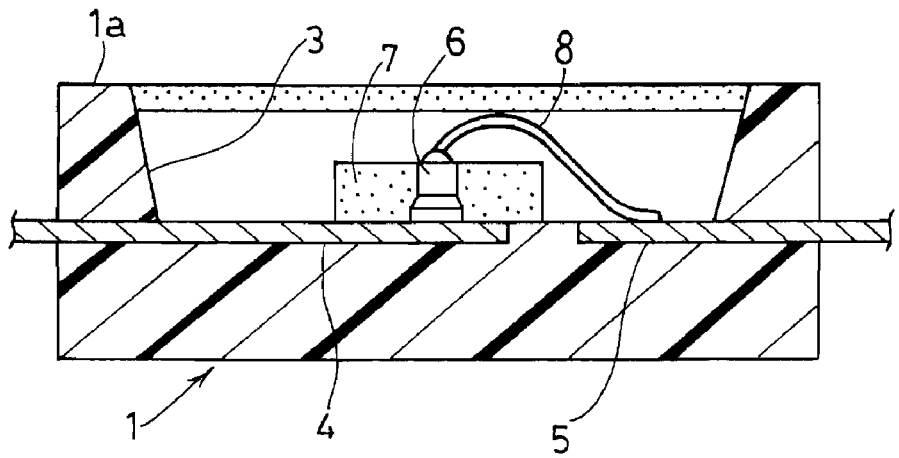
FIG. 8 is a sectional view showing a thin-type light emitting diode lamp according to a second embodiment of the present invention.

FIG. 8 is a sectional view showing a thin-type light emitting diode lamp according to a second embodiment of the present invention. In the light emitting diode lamp of this embodiment, the light transmitting layer 9 between the red light conversion layer 7 and the green light conversion layer 10 is not made of a light-transmitting synthetic resin but comprises a space. With this arrangement, since a light-transmitting synthetic resin for forming the light transmitting layer 9 between the red light conversion layer 7 and the green light conversion layer 10 is not necessary, the material cost reduces. The structure of other portions is the same as that of the first embodiment. In this embodiment again, the red light conversion layer 7 and the green light conversion layer 10 are not held in close contact with each other. Thus, the same advantages as those of the first embodiment are obtained.

Figure 9:
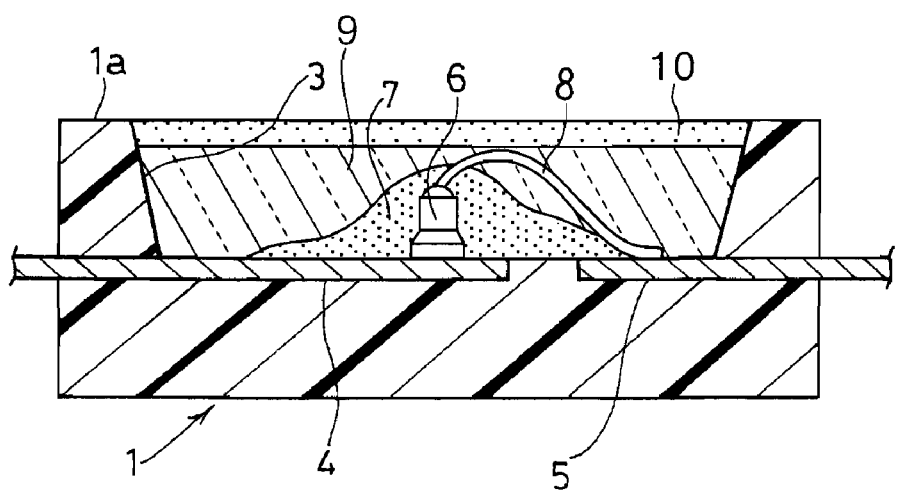
FIG. 9 is a sectional view showing a thin-type light emitting diode lamp according to a third embodiment of the present invention.

FIG. 9 is a sectional view showing a thin-type light emitting diode lamp according to a third embodiment of the present invention. In this light emitting diode lamp, the side surfaces of the blue light emitting diode chip 6 are not covered with the red light conversion layer 7 in advance. Specifically, in this embodiment, a blue light emitting diode chip 6 by itself is disposed at a substantial center of the inner bottom surface of a groove-shaped recess 3, and then a red light conversion layer 7 is formed to cover the blue light emitting diode chip. With this arrangement, it is not necessary to form the red light conversion layer 7 to cover the side surfaces of the blue light emitting diode chip 6 in advance. Further, by employing the method for manufacturing a thin-type light emitting diode lamp which will be described later, the manufacturing process is simplified. The structure of other portions is the same as that of the first embodiment. In this embodiment again, the red light conversion layer 7 and the green light conversion layer 10 are not held in close contact with each other. Thus, the possibility that the green light is directly absorbed by the red light conversion layer is reliably reduced.

Figure 10:
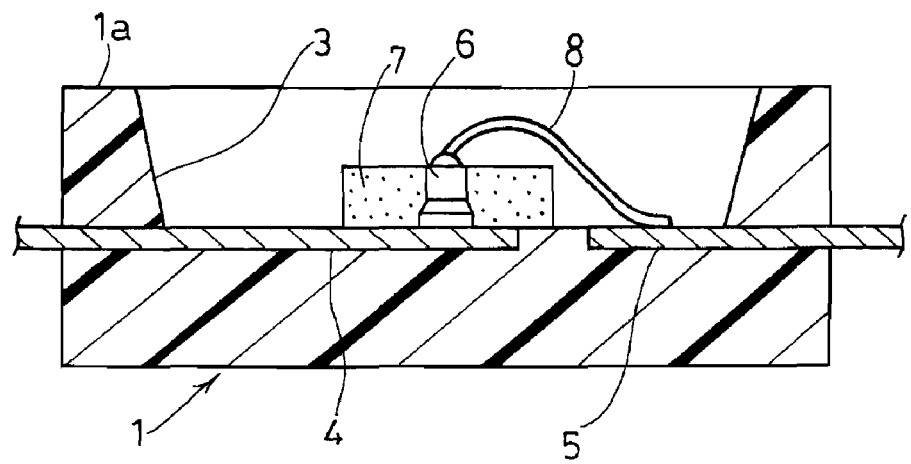
FIG. 10 shows a first step of a method for manufacturing a light emitting diode lamp according to the first embodiment.
Figure 11:
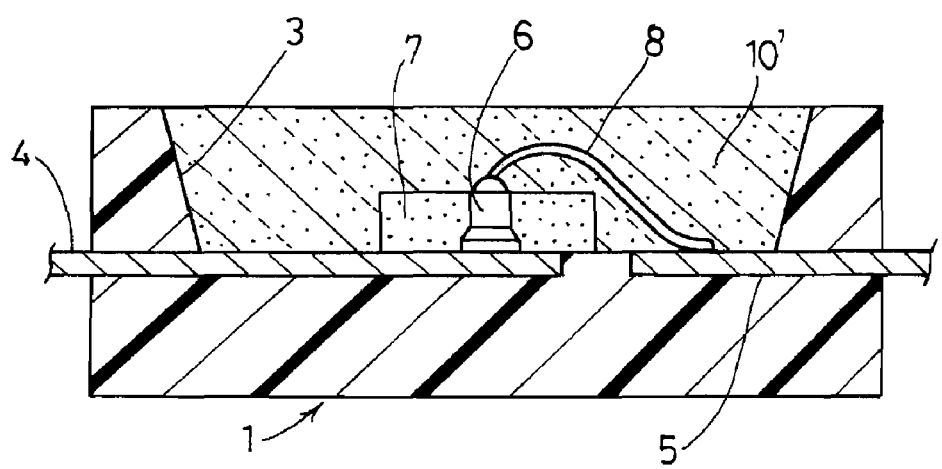
FIG. 11 shows a second step of the method for manufacturing a light emitting diode lamp according to the first embodiment.
Figure 12:
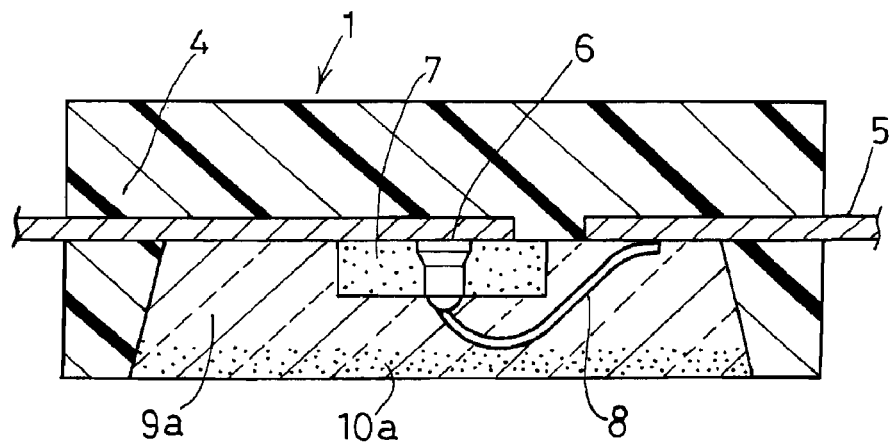
FIG. 12 shows a third step of the method for manufacturing a light emitting diode lamp according to the first embodiment.

FIGS. 10-12 show a method for manufacturing a thin-type light emitting diode lamp according to the first embodiment.

First, in this manufacturing method, a blue light emitting diode chip 6, which is covered with a red light conversion layer 7 in advance, is disposed at a substantial center of the inner bottom surface of the groove-shaped recess 3 of a lamp body 1, as shown in FIG. 10. In this process, the p-electrode 6e on the lower surface of the blue light emitting diode chip 6 is connected to the lead terminal 4 by die bonding. The n-electrode 6d on the upper surface is connected to the lead terminal 5 by wire bonding using a metal wire 8.

Then, as shown in FIG. 11, with the opening of the groove-shaped recess 3 oriented upward, an appropriate amount of light-transmitting synthetic resin 10' in a liquid state containing powder of a green fluorescent material is injected into the groove-shaped recess 3. In this process, the light-transmitting synthetic resin 10' is so injected as to cover the entirety of the blue light emitting diode chip 6 and red light conversion layer 7.

Then, as shown in FIG. 12, the opening of the groove-shaped recess 3 is oriented downward, and this posture is maintained for an appropriate time. It is to be noted that the light-transmitting synthetic resin 10' in a liquid state needs to have such viscosity as to prevent the dropping even in this posture. The powder of the green fluorescent material has a higher specific gravity than that of the light-transmitting synthetic resin. Thus, by maintaining this posture, the powder of the green fluorescent material contained in the light-transmitting synthetic resin 10' precipitates due to the difference in specific gravity. When the precipitation is completed or substantially completed, the light-transmitting synthetic resin 10' is hardened. The hardening may be performed by drying the solvent used for liquefying the light-transmitting synthetic resin 10' and ultraviolet radiation or heating to harden the light-transmitting synthetic resin 10'.

As shown in FIG. 12, by the above-described process, a green light conversion layer 10a containing powder of the green fluorescent material is formed at a portion furthest from the blue light emitting diode chip 6. Further, a light transmitting layer 9a which contains neither a red fluorescent material nor a green fluorescent material or contains only a small amount of green fluorescent material is formed between the green light conversion layer 10a and the red light conversion layer 7.

With the manufacturing method, the thin-type light emitting diode lamp according to the first embodiment is formed easily, so that the manufacturing cost reduces.

FIGS. 13-16 show a method for manufacturing a thin-type light emitting diode lamp according to the third embodiment.

First, in this manufacturing method, a blue light emitting diode chip 6 by itself is disposed at a substantial center of the inner bottom surface of the groove-shaped recess 3 of a lamp body 1. In this process, the p-electrode 6e on the lower surface of the blue light emitting diode chip 6 is connected to the lead terminal 4 by die bonding. The n-electrode 6d on the upper surface is connected to the lead terminal 5 by wire bonding using a metal wire 8.

Figure 13:
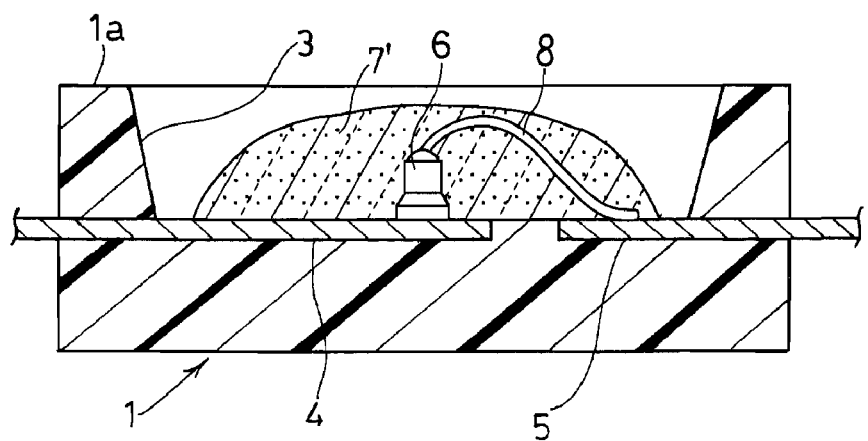
FIG. 13 shows a first step of a method for manufacturing a light emitting diode lamp according to the third embodiment.

Then, as shown in FIG. 13, with the opening of the groove-shaped recess 3 oriented upward, an appropriate amount of light-transmitting synthetic resin 7' in a liquid state containing powder of a red fluorescent material is injected into the groove-shaped recess 3. In this process, the light-transmitting synthetic resin 7' is so injected as to cover the entirety of the blue light emitting diode chip 6. As shown in FIG. 13, due to the surface tension by the viscosity, the light-transmitting synthetic resin 7' in a liquid state forms a shape like a convex lens swelling at the center.

Figure 14:
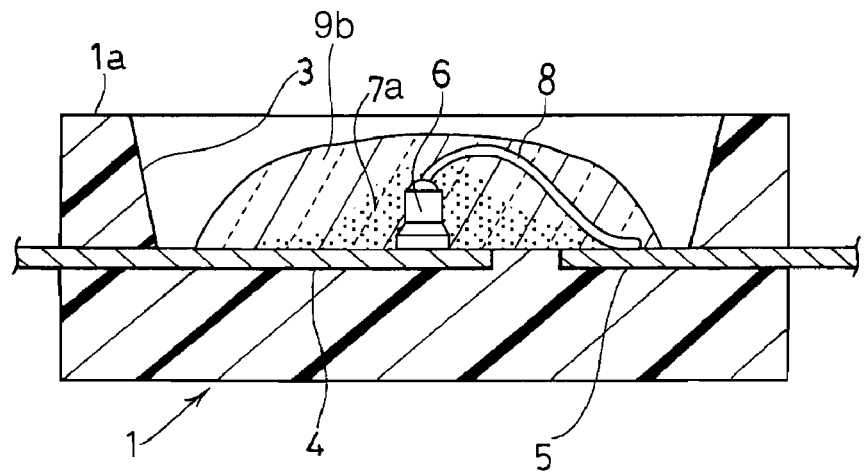
FIG. 14 shows a second step of the method for manufacturing a light emitting diode lamp according to the third embodiment.

Then, this posture is maintained for an appropriate time. The powder of the red fluorescent material also has a higher specific gravity than that of the light-transmitting synthetic resin. Thus, as shown in FIG. 14, by maintaining this posture, the powder of the red fluorescent material contained in the light-transmitting synthetic resin 7' precipitates due to the difference in specific gravity. When the precipitation is completed or substantially completed, the light-transmitting synthetic resin 7' is hardened.

As shown in FIG. 14, by the above-described process, the blue light emitting diode chip 6 is covered with the red light conversion layer 7a, and a light transmitting layer 9b which contains neither a red fluorescent material nor a green fluorescent material or contains only a small amount of red fluorescent material is formed on the outer side of the red light conversion layer 7a.

Figure 15:
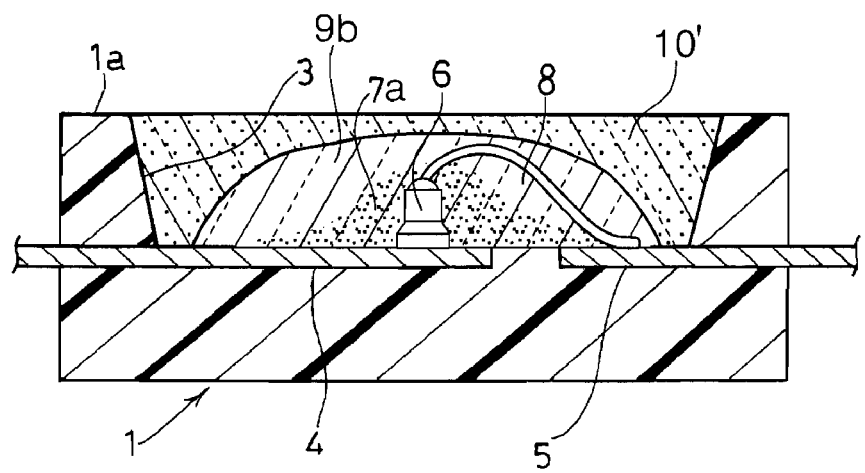
FIG. 15 shows a third step of the method for manufacturing a light emitting diode lamp according to the third embodiment.

Then, as shown in FIG. 15, with the opening of the groove-shaped recess 3 oriented upward, an appropriate amount of light-transmitting synthetic resin 10' in a liquid state containing powder of a green fluorescent material is injected into the groove-shaped recess 3. In this process, the light-transmitting synthetic resin 10' is so injected as to cover the entirety of the blue light emitting diode chip 6, red light conversion layer 7 and light transmitting layer 9b.

Figure 16:
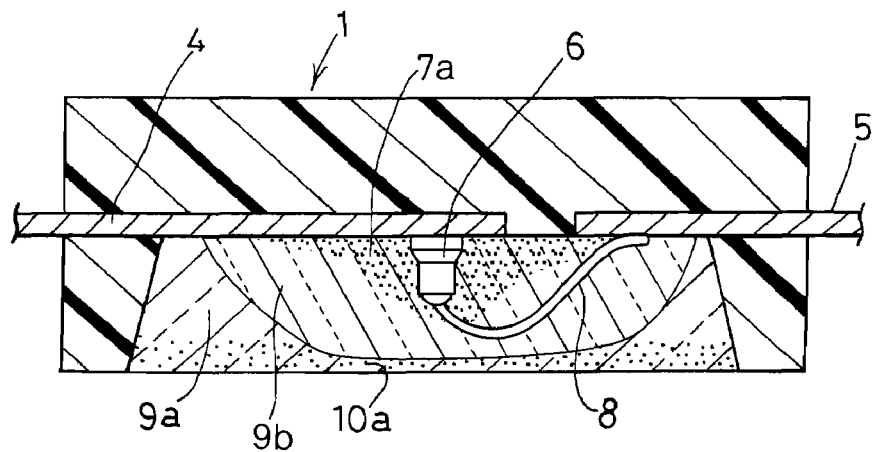
FIG. 16 shows a fourth step of the method for manufacturing a light emitting diode lamp according to the third embodiment.

Then, as shown in FIG. 16, the opening of the groove-shaped recess 3 is oriented downward, and this posture is maintained for an appropriate time. It is to be noted that the light-transmitting synthetic resin 10' in a liquid state needs to have such viscosity as to prevent the dropping even in this posture. The powder of the green fluorescent material has a higher specific gravity than that of the light-transmitting synthetic resin. Thus, by maintaining this posture, the powder of the green fluorescent material contained in the light-transmitting synthetic resin 10' precipitates due to the difference in specific gravity. When the precipitation is completed or substantially completed, the light-transmitting synthetic resin 10' is hardened.

As shown in FIG. 16, by the above-described process, a green light conversion layer 10a containing powder of green fluorescent material is formed at a portion furthest from the blue light emitting diode chip 6. Further, a light transmitting layer 9a which contains neither a red fluorescent material nor a green fluorescent material or contains only a little amount of green fluorescent material is formed between the green light conversion layer 10a and the light transmitting layer 9b.

With the above-described manufacturing method, the thin-type light emitting diode lamp according to the third embodiment is formed easily, so that the manufacturing cost reduces.

Figure 17:
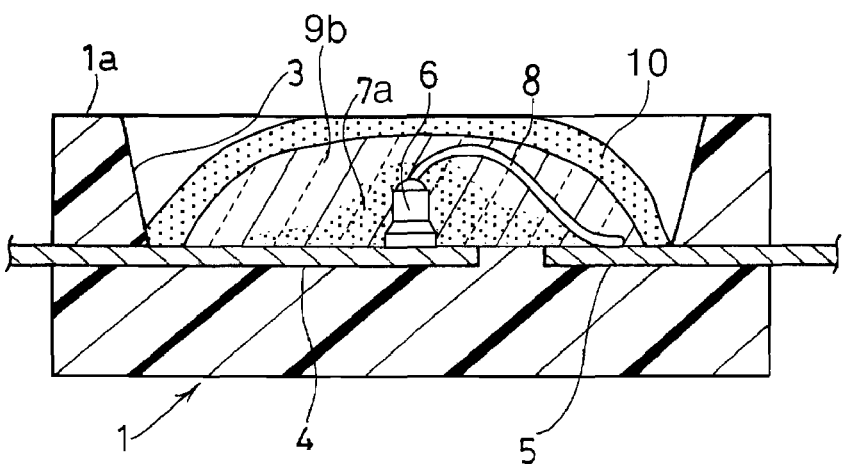
FIG. 17 shows a third step of anther method for manufacturing a light emitting diode lamp according to the third embodiment.

In the manufacturing method for the third embodiment, instead of injecting the light-transmitting synthetic resin 10' as shown in FIG. 15, a light-transmitting synthetic resin containing powder of a green fluorescent material may be applied to the outer surface of the light transmitting layer 9b. In this case, the hardening process is performed immediately after the application of the light-transmitting synthetic resin. By this process, as shown in FIG. 17, a green light conversion layer 10a is easily formed at a portion furthest from the blue light emitting diode chip 6.

In each of the foregoing embodiments, the paired lead terminals 4 and 5 embedded in the lamp body 1 may be replaced with an end surface 1a of the lamp body and an electrode film provided at the inner surface of the groove-shaped recess 3.

The invention claimed is:

1. A semiconductor light emitting lamp comprising:
 a lamp body formed with an elongated recess that includes a bottom surface and an opening;
 a blue light emitting element disposed at the bottom surface;
 a light-transmitting resin covering the blue light emitting element; and
 a green fluorescent material and a red fluorescent material both contained in the light-transmitting resin;
 wherein a concentration of the red fluorescent material is higher at a position close to the bottom surface and adjacent to the blue light emitting element than at a surface of the light-transmitting resin, and the concentration of the red fluorescent material is higher at a position adjacent to the blue light emitting element than at a position on the bottom surface and close to an end of the recess,
 wherein the blue light emitting element includes a first side surface and a second side surface, the first side surface being perpendicular to a longitudinal direction of the recess, the second side surface being parallel to the longitudinal direction, and wherein the light-transmitting resin includes a first portion and a second portion, the first portion being in contact with the first side surface, the second portion being in contact with the second side surface, the first portion being greater in thickness than the second portion.

2. The light emitting lamp according to claim 1, wherein the red fluorescent material and the green fluorescent material have mutually different concentration distributions.

3. The light emitting lamp according to claim 1, further comprising a lead connected to the blue light emitting element, wherein the bottom surface is flat, and the lead includes an exposed portion located at the bottom surface.

4. The light emitting lamp according to claim 3, wherein the blue light emitting element is bonded to the exposed portion of the lead.

5. The light emitting lamp according to claim 1, wherein the green fluorescent material is distributed overall in the opening of the recess.

6. A method of making a semiconductor light emitting lamp, the method comprising:
 preparing a lamp body formed with an elongated recess that includes a bottom surface and an opening;
 arranging a blue light emitting element on the bottom surface;
 supplying light-transmitting resin in a liquid state into the recess while the opening is kept oriented upward, so that the blue light emitting element is covered with the light-transmitting resin, wherein the light-transmitting resin contains powder of a red fluorescent material;
 allowing the powder of the red fluorescent material to precipitate toward the bottom surface in the light-transmitting resin for a predetermined time;
 hardening the light-transmitting resin after the predetermined time passes; and
 forming a light-transmitting resin layer on the hardened light-transmitting resin, the light-transmitting resin layer containing powder of a green fluorescent material,
 wherein the blue light emitting element includes a first side surface and a second side surface, the first side surface being perpendicular to a longitudinal direction of the recess, the second side surface being parallel to the longitudinal direction, and wherein the hardened light-transmitting resin includes a first portion and a second portion, the first portion being in contact with the first side surface, the second portion being in contact with the second side surface, the first portion being greater in thickness than the second portion.

7. The method according to claim 6, wherein the red fluorescent material and the green fluorescent material have mutually different concentration distributions.

8. The method according to claim 6, wherein the lamp body is provided with a lead connected to the blue light emitting element, and the lead includes an exposed portion located at the bottom surface of the recess.

9. The method according to claim 8, wherein the blue light emitting element is bonded to the exposed portion of the lead.

10. The method according to claim 6, wherein the light-transmitting resin layer containing the powder of the green fluorescent material is configured to entirely close the opening of the recess.

* * * * *